(12) United States Patent
Chun et al.

(10) Patent No.: US 11,978,370 B2
(45) Date of Patent: May 7, 2024

(54) COVER WINDOW AND FLEXIBLE DISPLAY DEVICE HAVING THE SAME

(71) Applicant: LG Display Co., Ltd., Seoul (KR)

(72) Inventors: Changwoo Chun, Cheonan-si (KR); Sejin Jang, Paju-si (KR); JooHye Park, Anyang-si (KR); Wansoo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 192 days.

(21) Appl. No.: 17/370,581

(22) Filed: Jul. 8, 2021

(65) Prior Publication Data

US 2022/0020298 A1 Jan. 20, 2022

(30) Foreign Application Priority Data

Jul. 14, 2020 (KR) .................. 10-2020-0086879

(51) Int. Cl.
*G09F 9/30* (2006.01)
*C09J 175/04* (2006.01)
(Continued)

(52) U.S. Cl.
CPC ............ *G09F 9/301* (2013.01); *C09J 175/04* (2013.01); *H10K 50/844* (2023.02);
(Continued)

(58) Field of Classification Search
CPC ................ H10K 50/844; H10K 50/84; H10K 2102/331; H10K 2102/351; H10K 2102/311; H05K 5/03; C09J 175/04; C09J 175/06; G02F 1/133331; G02F 1/133305; G06F 1/1641; G06F 1/1652; G09F 9/301; B32B 5/16; B32B 27/08; B32B 27/14; B32B 27/40; B32B 7/022; B32B 2250/24; B32B 2260/025; B32B 2260/046; B32B 2264/1021; B32B 2307/412; B32B 2307/536; B32B 2307/54;
(Continued)

(56) References Cited

U.S. PATENT DOCUMENTS 9,303,132 B2 4/2016 Enniss et al.
10,203,726 B2 2/2019 Rho et al.
(Continued)

FOREIGN PATENT DOCUMENTS

CN 101918215 A 12/2010
CN 107968154 A 4/2018
(Continued)

*Primary Examiner* — Ida M Soward
(74) *Attorney, Agent, or Firm* — Fenwick & West LLP (57) ABSTRACT

A cover window includes a first layer having a first modulus, a second layer disposed on the first layer and having a second modulus smaller than the first modulus, and a third layer disposed on the second layer and having a third modulus equal to or larger than the first modulus, and in which the third layer includes a nanoparticle-polyurethane complex in which polyurethane is bonded with nanoparticles by a covalent bond. Therefore, the cover window of the present disclosure provides effects that the folding and rolling are possible with excellent surface characteristic and the restorability against the pressing and excellent optical property. A flexible display device may include the cover window.

19 Claims, 5 Drawing Sheets

SILICA
THIRD POLYURETHANE (51) Int. Cl.
- *H10K 50/84* (2023.01)
- *H10K 50/844* (2023.01)
- *G02F 1/1333* (2006.01)
- *G06F 1/16* (2006.01)
- *H10K 102/00* (2023.01)

(52) U.S. Cl.
CPC .. *G02F 1/133305* (2013.01); *G02F 1/133331* (2021.01); *G06F 1/1641* (2013.01); *G06F 1/1652* (2013.01); *H10K 2102/331* (2023.02); *H10K 2102/351* (2023.02)

(58) Field of Classification Search
CPC ........ B32B 2307/546; B32B 2307/554; B32B 2307/584; B32B 2307/718; B32B 2307/732; B32B 2307/744; B32B 2307/51; B32B 2457/206; B32B 2457/20; G08G 18/3895; G08G 18/4241; G08G 18/73; G08G 18/7621; G08G 18/246; G08G 18/42; C09D 175/06; C08K 3/36; C08K 9/04

See application file for complete search history.

(56) References Cited

U.S. PATENT DOCUMENTS

| | | | |
|---|---|---|---|
| 10,626,292 B2 | 4/2020 | Kim et al. | |
| 10,658,615 B2 | 5/2020 | Oh et al. | |
| 10,976,610 B2 | 4/2021 | Kim et al. | |
| 2009/0181242 A1 | 7/2009 | Enniss et al. | |
| 2011/0027553 A1 | 2/2011 | Enniss et al. | |
| 2011/0281093 A1* | 11/2011 | Gulati | B32B 37/144 428/218 |
| 2012/0128952 A1* | 5/2012 | Miwa | B32B 17/10036 428/215 |
| 2013/0193543 A1* | 8/2013 | Rantala | H01L 21/02216 257/432 |
| 2015/0037553 A1* | 2/2015 | Mauro | C03C 3/091 428/212 |
| 2016/0194448 A1* | 7/2016 | Song | C08G 73/1067 428/473.5 |
| 2016/0378246 A1* | 12/2016 | Kim | B32B 27/308 345/173 |
| 2017/0152419 A1* | 6/2017 | Rantala | G06F 3/044 |
| 2017/0329368 A1 | 11/2017 | Rho et al. | |
| 2018/0112049 A1* | 4/2018 | Song | C08G 69/40 |
| 2018/0208793 A1 | 7/2018 | Kim et al. | |
| 2018/0231692 A1 | 8/2018 | Ham et al. | |
| 2018/0248150 A1 | 8/2018 | Oh et al. | |
| 2019/0039352 A1 | 2/2019 | Zhao et al. | |
| 2019/0106357 A1* | 4/2019 | Dejneka | B32B 17/1055 |
| 2020/0061967 A1 | 2/2020 | Cho et al. | |
| 2020/0133078 A1* | 4/2020 | Kim | G02F 1/133617 |
| 2020/0203608 A1 | 6/2020 | Jang et al. | |
| 2020/0216713 A1 | 7/2020 | Kim et al. | |
| 2020/0266368 A1* | 8/2020 | Park | H10K 77/111 |
| 2020/0410208 A1* | 12/2020 | Thothadri | G02B 1/18 |
| 2021/0292570 A1* | 9/2021 | Frey | C08K 13/06 |

FOREIGN PATENT DOCUMENTS

| | | | | |
|---|---|---|---|---|
| CN | 108472933 A | | 8/2018 | |
| CN | 110684397 A | | 1/2020 | |
| CN | 111103727 A | | 5/2020 | |
| CN | 111261040 A | | 6/2020 | |
| KR | 10-1777099 B | | 9/2017 | |
| KR | 10-2018-0098445 A | | 9/2018 | |
| KR | 20180099210 A | * | 9/2018 | ......... G02B 5/3033 |
| KR | 10-1939462 B | | 1/2019 | |
| KR | 10-2019-0129813 A | | 11/2019 | |
| WO | WO 2017/146866 A1 | | 8/2017 | |
| WO | WO-2018004094 A1 | * | 1/2018 | ......... C09D 175/04 |

* cited by examiner

COVER WINDOW AND FLEXIBLE DISPLAY DEVICE HAVING THE SAME

CROSS-REFERENCE TO RELATED APPLICATIONS

This application claims the priority of Republic of Korea Patent Application No. 10-2020-0086879 filed on Jul. 14, 2020, in the Korean Intellectual Property Office, the disclosure of which is incorporated herein by reference in its entirety.

BACKGROUND

Field

The present disclosure relates to a cover window and a flexible display device having the same, and more particularly, to a cover window which has a high surface hardness, an excellent rollability, excellent restorability against the pressing, and an excellent optical characteristic, and a display device having the same.

Description of the Related Art

As it enters an information era, a display field which visually expresses electrical information signals has been rapidly developed, and in response to this, various display devices having excellent performances such as thin-thickness, light weight, and low power consumption have been developed. Specific examples of such a display device include a liquid crystal display device (LCD), a plasma display panel device (PDP), a field emission display device (FED), an organic light emitting display device (OLED), and the like.

Recently, a shape or a size of the display device has gradually diversified and in particular, an interest in a flexible display device which maintains a display performance even though the display device is folded or rolled is consistently increasing. In accordance with this interest, researches and development on panels, fixtures, and cover windows having a specific radius of curvature are being actively conducted.

Specifically, the cover window is a component which is exposed to a user from an outer periphery of the display device. Accordingly, it is desirable to use a cover glass having excellent appearance characteristics, but it is also difficult to implement a foldability or a rollability due to the characteristic of the glass material.

Therefore, a cover window in which a hard coating layer which improves a surface hardness is applied to a polymer film such as transparent polyimide has been proposed. However, the polymer film to which the hard coating layer is applied also has a limitation in relieving a stress applied to the entire area during the rolling so that it is difficult to be applied to the rollable display device.

SUMMARY

An object to be achieved by the present disclosure is to provide a cover window which is foldable and rollable with an excellent surface characteristic and has an excellent resilient characteristic against the pressing and an excellent optical characteristic.

Another object to be achieved by the present disclosure is to provide a flexible display device which includes the cover window which effectively removes the stress applied to the cover window during the folding or rolling and has excellent surface characteristic and optical property.

Objects of the present disclosure are not limited to the above-mentioned objects, and other objects, which are not mentioned above, can be clearly understood by those skilled in the art from the following descriptions.

According to an aspect of the present disclosure, a cover window includes a first layer having a first modulus, a second layer disposed on the first layer and having a second modulus smaller than the first modulus, and a third layer disposed on the second layer and having a third modulus equal to or larger than the first modulus, and in which the third layer includes a nanoparticle-polyurethane complex in which polyurethane is bonded with nanoparticles by a covalent bond.

According to another aspect of the present disclosure, a flexible display device includes a display panel, and a cover window including a first layer disposed on one surface of the display panel and having a first modulus, a second layer disposed on the first layer and having a second modulus smaller than the first modulus, and a third layer disposed on the second layer and having a third modulus equal to or larger than the first modulus, and in which the third layer includes a nanoparticle-polyurethane complex in which polyurethane is bonded with nanoparticles by a covalent bond.

Other detailed matters of the exemplary embodiments are included in the detailed description and the drawings.

According to the present disclosure, the cover window has a structure in which a first layer, a second layer, and a third layer including polyurethane having an excellent elasticity are laminated. The first layer provides an excellent tensile property, the second layer provides an excellent resilient characteristic against the pressing, and the third layer includes a nanoparticle-polyurethane complex in which polyurethane is bonded with nanoparticles by a covalent bond to provide excellent slip property and surface hardness. Further, in the cover window of the present disclosure, the first layer, the second layer, and the third layer are formed based on the polyurethane so that adhesion property between interfaces and the optical property are excellent.

According to the present disclosure, the above-described cover window is disposed on the display panel so that a stress applied to the cover window when the display device is folded or rolled may be effectively removed and the surface characteristic is excellent.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a cover window according to exemplary embodiments of the present disclosure will be described in detail with reference to accompanying drawings.

Figure 1:
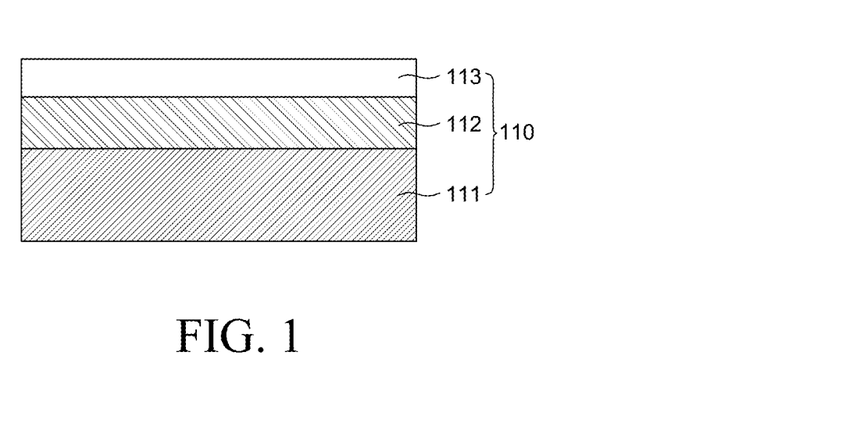
FIG. 1 is a cross-sectional view of a cover window according to an exemplary embodiment of the present disclosure.

FIG. 1 is a cross-sectional view of a cover window according to an exemplary embodiment of the present disclosure. Referring to FIG. 1, the cover window 110 according to the exemplary embodiment of the present disclosure includes a first layer 111, a second layer 112, and a third layer 113.

The first layer 111 has a first modulus, the second layer 112 has a second modulus which is smaller than the first modulus, and the third layer 113 has a third modulus which is equal to or larger than the first modulus. Accordingly, the first layer 111 has an excellent tensile property and hardness to reduce the pressing, the second layer 112 provides an excellent restorability while facilitating the folding or rolling, and the third layer 113 provides an excellent surface hardness. Therefore, the cover window may be easily used for the flexible display device which is foldable or rollable.

The first layer 111, the second layer 112, and the third layer 113 may be formed of polyurethane, respectively.

The polyurethane is formed by polymerization of polyol and diisocyanate compounds and is configured by a soft segment formed of a polyol and a hard segment formed of a diisocyanate compound.

For example, the polyol may be a polyester polyol formed by a condensation reaction of dicarboxylic acids and diols. The polyester polyol may improve physical properties such as elasticity, a wear resistance, and a tear strength of polyurethane.

For example, the dicarboxylic acid may be selected from an adipic acid, a phthalic acid, an isophthalic acid, a terephthalic acid, a succinic acid, a glutaric acid, a suberic acid, an azelaic acid, a sebacic acid, a decanedicarboxylic acid, a maleic acid, and a fumaric acid, but is not limited thereto. Further, dicarboxylic acid esters or dicarboxylic anhydrides corresponding to the dicarboxylic acid may also be selected.

For example, the diol may be an alkane diol, a glycol ether, or a mixture thereof. For example, the alkane diol may be selected from an ethanediol, a propanediol, a butanediol, a hexanediol, a decanediol, or the like, but is not limited thereto. For example, the glycol ether may be selected from a diethylene glycol, a dipropylene glycol, or the like, but is not limited thereto.

The polyurethane exhibits different physical properties depending on a molecular weight, a ratio of a hard segment to a soft segment, and a type of polyol and diisocyanate compound.

Hereinafter, the first layer 111, the second layer 112, and the third layer 113 will be described in detail.

The first layer 111 is configured to have a first modulus of 50 MPa to 100 MPa. Within this range, the first layer 111 has excellent tensile property and hardness to minimize the dent generated when the cover window 110 is folded or rolled.

The first layer 111 includes a first polyurethane.

For example, the first polyurethane includes a soft segment formed by polyols formed by a condensation reaction of a dicarboxylic acid, an alkane diol, and a glycol ether and a hard segment formed of a diisocyanate compound. In this case, the first layer 111 has excellent hardness and tensile property to minimize the pressing during the rolling and folding.

As another example, the first polyurethane includes a soft segment formed of polyols represented by following Formula 1-1.

[Formula 1-1]

For example, in Formula 1-1, R1 is a chain or branched alkylene of 2 to 12 carbon atoms, R2 is an alkylene of 2 to 12 carbon atoms or a phenylene, R3 is an ether group of 2 to 12 carbon atoms, and a is an integer of 1 or larger.

As another example, in Formula 1-1, R1 is a chain alkylene of 2 to 6 carbon atoms, R2 is a chain alkylene of 2 to 6 carbon atoms, R3 is an ether group of 2 to 8 carbon atoms, and a is an integer of 10 to 10000. In this case, the tensile property and the hardness of the first polyurethane are more excellent.

As a specific example, the first polyurethane may include a soft segment formed of polyols formed by a condensation reaction of an adipic acid, a 1, 2-ethanediol, and a diethylene glycol, but is not limited thereto.

For example, the first polyurethane may be formed by the condensation reaction of the polyols represented by Formula 1-1 and aromatic diisocyanates. As described above, when the aromatic diisocyanates are used, the hardness is excellent so that the dent generated during the folding or rolling may be reduced.

For example, the aromatic diisocyanate may be selected from a toluene diisocyanate, a methylbenzene diisocyanate, a diphenylmethane diisocyanate, or the like, but is not limited thereto.

For example, the first polyurethane may include a repeating unit represented by the following Formula 2-1.

[Formula 2-1]

For example, in Formula 2-1, R4 is an aryl group of 6 to 20 carbon atoms, x is an integer of 10 to 10000, and R1, R2, and a are the same as defined in the above Formula 1-1.

For example, a weight average molecular weight of the first polyurethane may be 65000 g/mol to 85000 g/mol or 70000 g/mol to 800000 g/mol. Within this range, the first layer 111 has an excellent hardness and a strong resistance against the pressing so that the generation of the dent may be reduced.

For example, the first layer 111 has a thickness of 150 μm to 250 μm or 200 μm to 250 μm and within this range, both the stretchability and the stretching recovery of the cover window 110 are excellent.

The second layer 112 is laminated on the first layer 111. The second layer 112 is configured to have a second modulus which is smaller than the first modulus. For example, the second layer 112 is configured to have a second modulus of 5 MPa to 20 MPa or 5 MPa to 15 MPa. The second layer 112 has a modulus smaller than that of the first layer 111 so that when the cover window 110 is rolled or folded, the resilient property against the pressing may be supplemented. That is, when the cover window 110 is rolled and folded and then unfolded, the second layer 112 recovers the pressed mark so as not to remain.

The second layer 112 includes a second polyurethane.

For example, the second polyurethane includes a soft segment formed by polyols formed by a condensation reaction of a dicarboxylic acid and an alkane diol and a hard segment formed of a diisocyanate compound. In this case, the recovery property against the pressing of the second layer 112 is excellent.

As another example, the second polyurethane includes a soft segment formed of polyols represented by following Formula 1-2.

[Formula 1-2]

For example, in Formula 1-2, R1 is a chain or branched alkylene of 2 to 12 carbon atoms, R2 is an alkylene of 2 to 12 carbon atoms or a phenylene, and b is an integer of 1 or larger.

As another example, in Formula 1-2, R1 is a chain alkylene of 2 to 6 carbon atoms, R2 is a chain alkylene of 2 to 6 carbon atoms, and b is an integer of 10 to 10000. In this case, the recovery property against the pressing of the second layer 113 is more excellent.

As a specific example, the second polyurethane may include a soft segment formed of polyols formed by a condensation reaction of the adipic acid and the 1, 2-ethanediol, but is not limited thereto.

For example, the first polyurethane may be formed by the condensation reaction of polyols represented by Formula 1-2 and aliphatic diisocyanates. As described above, when the aliphatic diisocyanate is used, an optical property is excellent due to high light resistance.

For example, the aliphatic diisocyanate may be selected from a hexamethylene diisocyanate, an isophorone diisocyanate, a dicyclohexylmethane diisocyanate, a cyclohexylmethane diisocyanate, and the like, but is not limited thereto.

For example, the second polyurethane may include a repeating unit represented by the following Formula 2-2.

[Formula 2-2]

For example, in Formula 2-2, R5 is an alkylene of 4 to 20 carbon atoms or a cycloalkylene of 6 to 20 carbon atoms, y is an integer of 10 to 10000, and R1, R2, and b are the same as defined in the above Formula 1-2. In this case, the folding and the rolling are easy and the restorability against the pressing is excellent.

For example, a weight average molecular weight of the second polyurethane may be 90000 g/mol to 120000 g/mol or 90000 g/mol to 100000 g/mol. Within this range, the restorability of the second layer 112 is excellent so that when the cover window 110 is folded and rolled and then unfolded, the pressed mark may be recovered so as not to remain.

For example, the second layer 112 may have a thickness of 30 μm to 55 μm or 45 μm to 55 μm and within this range, both the restorability, the hardness, and the like are excellent. When the thickness of the second layer 112 is too large, the restorability is degraded so that the dent may be generated and the hardness may also be degraded.

The third layer 113 is laminated on the second layer 112. The third layer 113 is configured to have a third modulus which is equal to or larger than the first modulus. For example, the third layer 113 is configured to have a third modulus of 100 MPa to 250 MPa or 150 MPa to 220 MPa. Desirably, the third layer 113 may be configured to have a modulus larger than those of the first layer 111 and the second layer 112. The third layer 113 is laminated on a top layer of the cover window 110 to be directly exposed to the user so that it is specifically important to ensure the surface characteristic. The third layer 113 is configured to have a modulus larger than those of the first layer 111 and the second layer 112 so that there is an advantage in that the surface hardness, the scratch resistance, the wear resistance, and the slip resistance are excellent.

The third layer 113 includes nano-particles and a third polyurethane. The third polyurethane is bonded with the nanoparticle surface by a covalent bond to form a nanoparticle-polyurethane complex.

For example, the third polyurethane includes a soft segment formed by polyols formed by a condensation reaction of a dicarboxylic acid and glycol ether and a hard segment formed of a diisocyanate compound. In this case, the third layer 113 has a high modulus and an excellent surface hardness to provide excellent surface characteristics such as a scratch resistance and a wear resistance.

As another example, the third polyurethane includes a soft segment formed of polyols represented by following Formula 1-3.

[Formula 1-3]

For example, in Formula 1-3, R2 is an alkylene of 2 to 12 carbon atoms or a phenylene, R3 is an ether group of 2 to 12 carbon atoms, and c is an integer of 1 or larger.

As another example, in Formula 1-3, R2 is a chain alkylene of 2 to 6 carbon atoms, R3 is an ether group of 2 to 8 carbon atoms, and c is an integer of 10 to 10000. In this case, the surface characteristic of the third layer 113 is more excellent.

As a specific example, the third polyurethane may include a soft segment formed of polyols formed by a condensation reaction of the adipic acid and the diethylene glycol, but is not limited thereto.

For example, the third polyurethane may be formed by the condensation reaction of polyols represented by Formula 1-3 and aromatic diisocyanates. The hard segment configured by the aromatic diisocyanate has an excellent hardness so that the surface characteristics of the third layer 113, such as a scratch resistance and a wear resistance, may be further improved.

For example, the aromatic diisocyanate may be selected from a toluene diisocyanate, a methylbenzene diisocyanate, a diphenylmethane diisocyanate, or the like, but is not limited thereto.

For example, the third polyurethane may include a repeating unit represented by the following Formula 2-3.

[Formula 2-3]

$$\left[ \begin{matrix} O \\ \parallel \\ C \end{matrix} - N - R_4 - N - \begin{matrix} O \\ \parallel \\ C \end{matrix} - O - R_3 \left( O - \begin{matrix} O \\ \parallel \\ R_2 \end{matrix} - \begin{matrix} O \\ \parallel \\ C \end{matrix} - O - R_3 \right)_c O \right]_z$$

For example, in Formula 2-3, R4 is an aryl group of 6 to 20 carbon atoms, z is an integer of 10 to 10000, and R2, R3, and c are the same as defined in the above Formula 1-3.

For example, a weight average molecular weight of the third polyurethane may be 30000 g/mol to 60000 g/mol or 40000 g/mol to 60000 g/mol. Within this range, the surface hardness of the third layer 113 is specifically excellent.

Hereinafter, a configuration of forming a nanoparticle-third polyurethane complex by integrating the third polyurethane on the nanoparticle surface by means of a covalent bond will be described in more detail.

The nanoparticle may further improve the surface hardness, the slip property, and the scratch resistance of the third layer 113. The nanoparticles have a light scattering characteristic so that they may degrade an optical property of the layer and when the nanoparticles are not uniformly dispersed in the polymer, but are aggregated, it may be visibly recognized.

Therefore, the nanoparticles and the third polyurethane are not physically mixed, but are bonded with each other by a covalent bond so that the surface characteristic of the third layer 113 may be improved without degrading the optical property.

For example, the nanoparticles may be silica sol. The silica sol may include a plurality of silanol groups on its surface. The silanol group may form a covalent bond by means of a condensation reaction with the diisocyanate (OCN—R—NCO) which configures a hard segment of the polyurethane. That is, the surface of the silica sol is modified with the diisocyanate groups Accordingly, the condensation polymerization of the polyols and the diisocyanate is possible on the surface of the silica particle and a silica-polyurethane complex in which the polyurethane is bonded onto the surface of the silica may be formed.

As another example, the nanoparticles may be a silica with a surface modified with a hydroxyl group. The hydroxyl group on the silica surface may also form silica modified with a diisocyanate group by means of the condensation reaction with the diisocyanate.

For example, 1 to 4 parts by weight of the nanoparticles may be included based on 100 parts by weight of a diisocyanate compound. Within this range, it is advantageous in that both the surface characteristic and the optical property of the third layer 113 are excellent. Desirably, 1.3 to 2.5 parts by weight of the nanoparticles may be included based on 100 parts by weight of a diisocyanate compound. Within this range, it is advantageous that the surface characteristics of the third layer 113, such as the surface hardness and the wear resistance, are more excellent and the third layer 113 is further optically transparent and has a low haze.

For example, a silica-third polyurethane complex in which the third polyurethane is bonded on the surface of the silica particle may be formed by reacting the silica sol, the polyol represented by Formula 1-3, and the aromatic diisocyanate.

As a specific example, the silica-third polyurethane complex may be represented by the following Formula 3.

[Formula 3]

In Formula 3, R2, R3, R4, c, and z are the same as defined in Formula 2-3.

Further, as it will be represented in the following Formula 4, the silica-third polyurethane complex may be bonded to an adjacent silica-third polyurethane complex to be coupled to each other.

[Formula 4]

In Formula 4, R2, R3, R4, c, and z are the same as defined in Formula 2-3.

Figure 2:
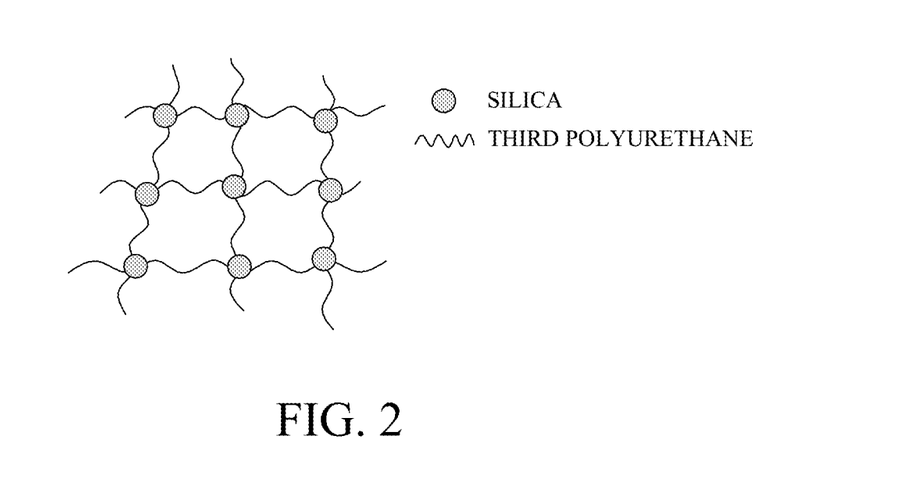
FIG. 2 is a diagram for explaining a network structure of a silica-third polyurethane complex.

FIG. 2 is a diagram for explaining a network structure of a silica-third polyurethane complex. In Formula 4, only the coupling between two adjacent silica particles is illustrated, but is not limited thereto. As illustrated in FIG. 2, the silica-third polyurethane complex is bonded to the adjacent silica-third polyurethane to form a network structure.

As illustrated in FIG. 2, the silica-third polyurethane complexes form a network structure so that advantages in that the folding and the rolling are easy and the surface hardness is excellent are provided.

Further, when the nanoparticles are physically mixed, the nanoparticles are easily aggregated to be recognized with the naked eye. However, as illustrated in FIG. 2, when the silica-third polyurethane complexes form a network structure by the chemical bond, the nanoparticles are uniformly dispersed without being aggregated so that the surface characteristic and the optical property are excellent.

Further, the flexibility of the polyurethane itself allows the cover window to be easily folded or rolled and the silica-third polyurethane complexes form the network structure so as to be folded (or rolled) or expand without being deformed.

For example, the thickness of the third layer 113 may be 5 μm to 10 μm. Within this range, the slip property, the wear resistance, and the scratch resistance of the cover window 110 are excellent. When the thickness of the third layer 113 is smaller than 5 μm, the slip property and the surface hardness are degraded and when the thickness of the third layer exceeds 10 μm, a haze value is increased so that the optical property may be degraded.

A total thickness of the cover window 110 including the first layer 111, the second layer 112, and the third layer 113 may be 300 μm to 400 μm. Within this range, when the cover window is applied to the flexible display device so that when the display device is folded and rolled, the stress which is applied to the cover window 110 is effectively alleviated and the thickness of the display device is not significantly increased. Further, when the cover window is applied to a display device having a touch function, if the thickness of the cover window 110 is too large, a touch sensitivity may be degraded so that it is desirable to appropriately adjust the total thickness of the cover window 110.

The cover window 110 according to the exemplary embodiment of the present disclosure has a structure in which the first layer 111, the second layer 112, and the third layer 113 are laminated. However, since each layer has the polyurethane as a main component, an interfacial adhesiveness is excellent and a variation in the optical property is low so that the layers may be considered as a single layer. Further, the modulus of the polyurethane included in each layer is adjusted so that the folding and the rolling are possible and the restorability against the pressing is excellent. Further, even though the third layer 113 which is visible to the user has the polyurethane having an excellent elasticity as a main component, the polyurethane is bonded with the nanoparticles so that the surface characteristics such as the slip property, the scratch resistance, and the wear resistance are excellent.

Hereinafter, the effects of the present disclosure will be described in more detail with reference to Examples and Comparative Examples. However, the following Examples are set forth to illustrate the present disclosure, but the scope of the disclosure is not limited thereto.

Preparative Example 1: Preparation of First Polyurethane

At the room temperature, 140.1 g of adipic acid, 105.1 g of diethylene glycol, 65.05 g of ethylene glycol, and 15.32 g of trimethylolpropane were added to the reactor and the temperature was raised to 200° C. Next, titanium isopropoxide was added to the reactor. Next, the reactor was depressurized to reach a full vacuum and then reacted at 200° C. for 10 hours to obtain a polyol represented by Formula 1-1. Next, a product was cooled to 130° C., was subject to the vacuum processing at 130° C. for 2 hours, and then cooled to 75° C. Next, 18.24 g of toluene diisocyanate, 0.44 g of monomethyl ether hydroquinone, 0.466 g of butylated hydroxy toluene, and 0.426 g of dibutyl-tin-dilaulate were added and reacted at 70 to 80° C. for 3 hours to obtain the first polyurethane (weight average molecular weight:approximately 70000 g/mol) represented by Formula 2-1.

Preparative Example 2: Preparation of Second Polyurethane

At the room temperature, 120.1 g of adipic acid, 165.05 g of ethylene glycol, and 14.32 g of trimethylolpropane were added to the reactor and the temperature was raised to 200° C. Next, titanium isopropoxide was added to the reactor. Next, the reactor was depressurized to reach a full vacuum and then reacted at 200° C. for 10 hours to obtain a polyol represented by Formula 1-2. Next, a product was cooled to 130° C., was subject to the vacuum processing at 130° C. for 2 hours, and then cooled to 75° C. Next, 12.24 g of hexamethylene diisocyanate, 0.34 g of monomethyl ether hydroquinone, 0.266 g of butylated hydroxy toluene, and 0.326 g of dibutyl-tin-dilaulate were added and reacted at 70 to 80° C. for 3 hours to obtain the second polyurethane (weight average molecular weight:approximately 100000 g/mol) represented by Formula 2-2.

Preparative Example 3: Preparation of Silica-Third Polyurethane Complex

At the room temperature, 120.1 g of adipic acid, 175.1 g of diethylene glycol, and 14.32 g of trimethylolpropane were added to the reactor and the temperature was raised to 200° C. Next, titanium isopropoxide was added to the reactor. Next, the reactor was depressurized to reach the full vacuum and then reacted at 200° C. for 10 hours to obtain a polyol represented by Formula 1-3. Next, a product was cooled to 130° C., was subject to the vacuum processing at 130° C. for 2 hours, and then cooled to 75° C. Next, 23.24 g of toluene diisocyanate, 0.54 g of monomethyl ether hydroquinone, 0.566 g of butylated hydroxy toluene and 0.626 g of dibutyl-tin-dilaulate, and 15.04 g of colloid nano silica at 5 wt % were added and reacted at 70 to 80° C. for 3 hours to produce a silica-third polyurethane complex represented by Formula 4. At this time, it was confirmed that a weight average molecular weight of the third polyurethane complex was approximately 50000 g/mol.

Preparative Example 4: Preparation of Silica-Third Polyurethane Complex

The silica-third polyurethane complex represented by Formula 4 was prepared in the same manner and conditions as in Preparative Example 3 except that 11.64 g of colloid nano silica with a concentration of 3 wt % was added, instead of 15.04 g of colloid nano silica with a concentration of 5 wt % in Preparative Example 3. At this time, it was confirmed that a weight average molecular weight of the third polyurethane complex was approximately 50000 g/mol.

Preparative Example 5: Preparation of Silica Mixed Third Polyurethane

First, fumed silica (Aerosil 200) was dispersed in a solvent of isopropyl alcohol:isobutyl isobutyrate (6:4) to prepare a non-reactive silica dispersion liquid with a concentration of 5 wt %.

Next, the third polyurethane was synthesized in the same manner and conditions as in Preparative Example 3 except that 15.04 g of non-reactive silica dispersion liquid with a concentration of 5 wt % was added, instead of 15.04 g of colloid nano silica with a concentration of 5 wt % in Preparative Example 3. The third polyurethane prepared as described above is not bonded onto the silica surface, but physically dispersed.

Preparative Example 6: Preparation of Silica and Dispersant Mixed Third Polyurethane First, after preparing a dispersion liquid with a concentration of 3 wt % by dispersing fumed silica (Aerosil 200) in a solvent of isopropyl alcohol:isobutyl isobutyrate (6:4), 1.5 g of 3-aminopropyltriethoxysilane was added as a dispersant to prepare a non-reactive silica dispersion liquid.

Next, the third polyurethane was synthesized in the same manner and conditions as in Preparative Example 3 except that 11.64 g of non-reactive silica dispersion liquid with a concentration of 3 wt % was added, instead of 15.04 g of colloid nano silica with a concentration of 5 wt % in Preparative Example 3. The third polyurethane prepared as described above is not bonded onto the silica surface, but physically dispersed.

Example 1

A cover window was manufactured by forming a first layer with a thickness of 240 μm including the first polyurethane according to Preparative Example 1, laminating a second layer with a thickness of 50 μm including the second polyurethane according to Preparative Example 2 on the first layer, and then laminating a third layer with a thickness of 10 μm including a silica-third polyurethane complex according to Preparative Example 3.

Example 2

The cover window was manufactured in the same manner as in Example 1 except that the third layer was prepared using the silica-third polyurethane complex according to Preparative Example 4, instead of the silica-third polyurethane complex according to Preparative Example 3, in Example 1.

Comparative Example 1

The cover window was manufactured in the same manner as in Example 1 except that the third layer was prepared using the third polyurethane according to Preparative Example 5, instead of the silica-third polyurethane complex according to Preparative Example 3, in Example 1.

Comparative Example 2

The cover window was manufactured in the same manner as in Example 1 except that the third layer was prepared using the third polyurethane according to Preparative Example 6, instead of the silica-third polyurethane complex according to Preparative Example 3, in Example 1.

The surface characteristic and the optical property of the cover window manufactured by Example 1, Example 2, Comparative Example 1, and Comparative Example 2, respectively, were evaluated by the following manner.

Experimental Example 1: Evaluation of Surface Characteristic 1-1. Surface Hardness (Pencil Hardness Test)

A surface of a specimen was scratched with a pencil under the condition of an angle of 45 degrees and a speed of 300 mm/min while applying a load of 500 g to the specimen and then whether the surface was scratched was observed with the naked eye. The result thereof was filled in the following Table 1.

1-2. Wear Resistance (Steel-Wool Wear Test)

The surface of the specimen was reciprocatively rubbed using the steel wool (#0000) at a speed of 2400 mm/min while applying a load of 500 g to the specimen to observe the surface with the naked eye. The number of times of reciprocating was measured when one or more scratches were observed with the naked eye and the result thereof was filled in the following Table 1.

1-3. Pressing Property (Pen Pressing Test)

After pressing the specimen with a pencil for one minute while applying a load of 750 g to the specimen, whether the specimen was scratched, pressed, or torn was observed with the naked eye. A result thereof was illustrated in FIGS. 4A and 4B.

Experimental Example 2: Evaluation of Optical Characteristic 2-1. Measurement of Transmittance After making parallel ray be incident perpendicular to an interface of the specimen using a hazemeter (COH 400 manufactured by Nippon Denshoku), a ratio of transmitted light with respect to incident light was measured to calculate the transmittance. The result thereof was filled in the following Table 1.

2-2. Measurement of Haze

After making parallel ray be incident perpendicular to an interface of the specimen using a hazemeter (COH 400 manufactured by Nippon Denshoku), a ratio of scattered light with respect to an amount of all transmitted light was measured to calculate the haze. The result thereof was filled in the following Table 1.

Experimental Example 3: Measurement of Modulus

A Young's modulus of each layer was measured at the room temperature (25° C.) using a tensile tester. The result thereof was filled in the following Table 1.

TABLE 1

|  |  | Example 1 | Example 2 | Comp. Ex. 1 | Comp. Ex. 2 |
|---|---|---|---|---|---|
| Surface characteristic | Pencil hardness | 1 H | 3 H | 6 B | 3 B |
|  | Wear resistance | 100 times | 500 times | 1 time | 10 times |
| Optical property | Transmittance | 83.6% | 90.1% | 70.6% | 80.3% |
|  | Haze | 3.2 | 0.89 | 14.6 | 6.3 |
| Modulus of first layer |  | 72.6 MPa | 72.6 MPa | 72.6 MPa | 72.6 MPa |
| Modulus of second layer |  | 9.7 MPa | 9.7 MPa | 9.7 MPa | 9.7 MPa |
| Modulus of third layer |  | 198 MPa | 200 MPa | 137 MPa | 137 MPa |

Referring to Table 1, it is possible to confirm that Examples 1 and 2 including the third layer formed by the silica-third polyurethane complex provided more excellent surface characteristic and optical property than Comparative Examples 1 and 2 in which silica particles were simply dispersed. Specifically, in the case of Example 2 in which less colloid silica was added, it is confirmed that the surface characteristic was excellent with the pencil hardness of 3H and the number of times of wear resistance tests of 500 times, the transmittance was 90.1% which was the highest, and the haze was 0.89 which was the lowest.

In contrast, it is confirmed that Comparative Example 1 with a structure in which the non-reactive silica was used to simply disperse silica particles in the third polyurethane had the worst surface characteristic. Further, the transmittance was 70.6% which was the lowest and the haze was 14.6 which was the highest so that the optical property was also significantly poor. Further, it is confirmed that in the case of Comparative Example 2 in which the dispersant was further added, the surface characteristic and the optical property were improved as compared with Comparative Example 1, but were worse than Examples 1 and 2.

Figure 3A:
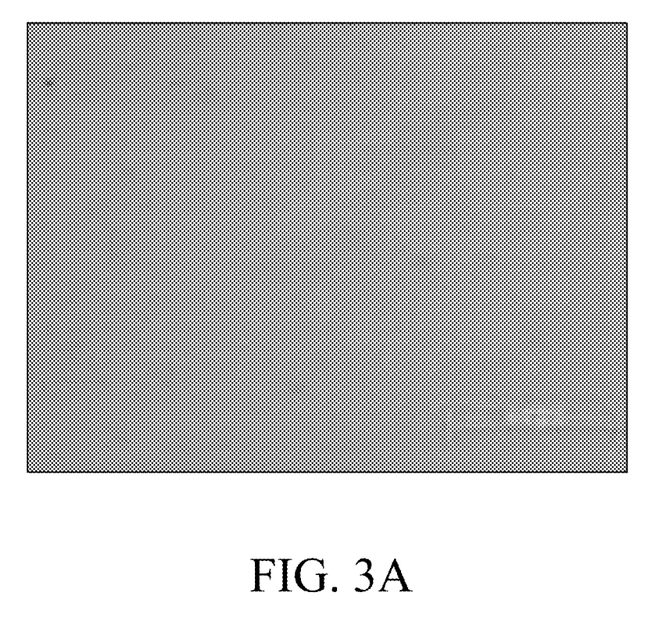
FIG. 3A is a micrograph of a cover window according to Example 1.
Figure 3B:
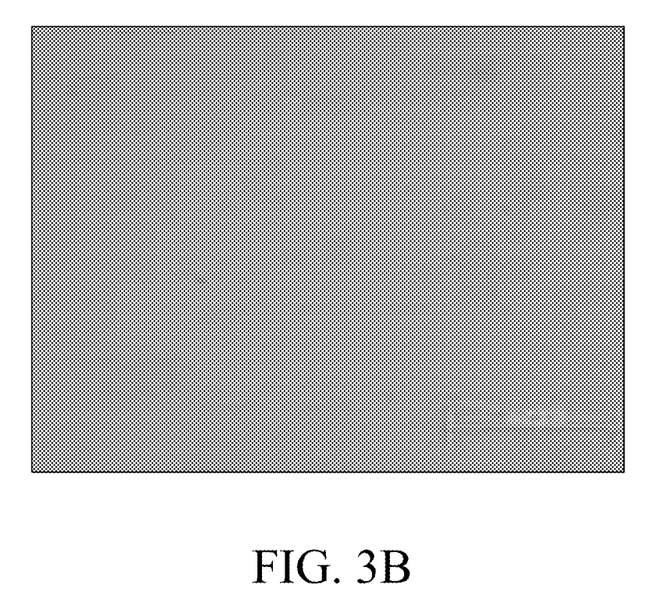
FIG. 3B is a micrograph of a cover window according to Example 2.
Figure 3C:
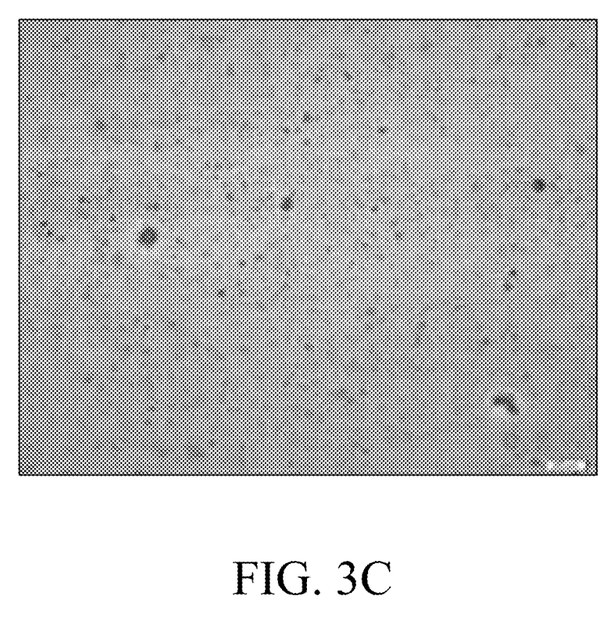
FIG. 3C is a micrograph of a cover window according to Comparative Example 1.
Figure 3D:
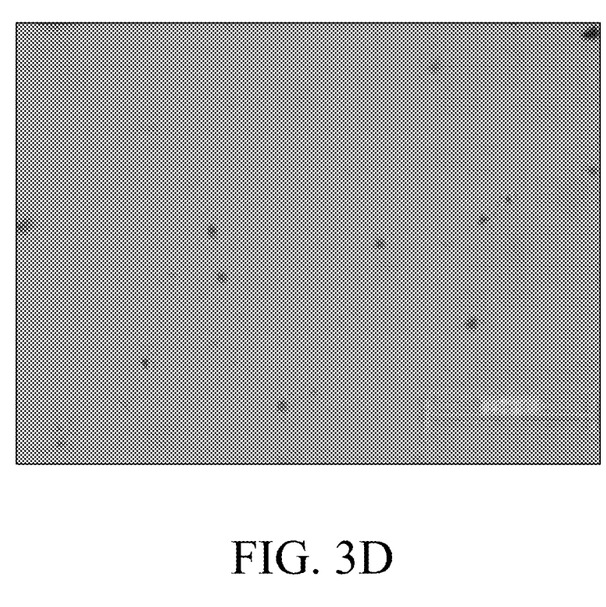
FIG. 3D is a micrograph of a cover window according to Comparative Example 2.

FIGS. 3A to 3D are micrographs of a cover window according to Example 1, Example 2, Comparative Example 1, and Comparative Example 2, respectively. Referring to FIGS. 3A and 3B, it is confirmed that in the cover window according to Examples 1 and 2, silica particles were not visibly recognized. In contrast, referring to FIGS. 3C and 3D, it is confirmed that in the cover window according to Comparative Examples 1 and 2, silica particles were not uniformly dispersed, but were aggregated.

Figure 4A:
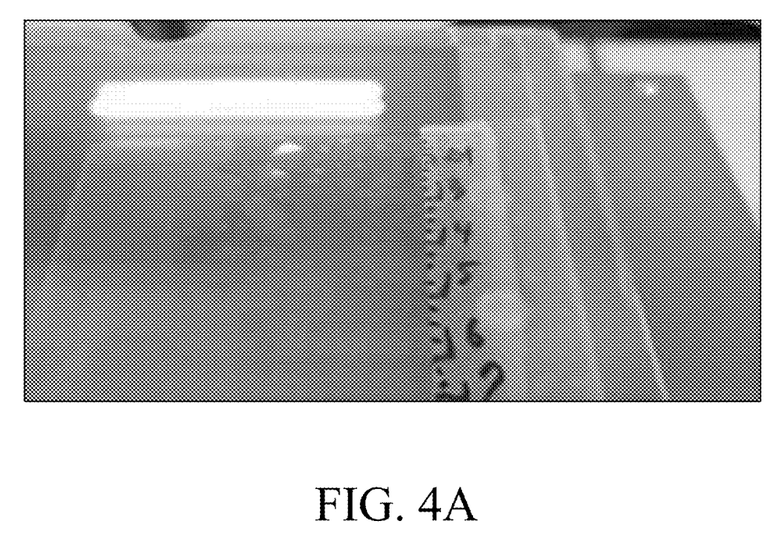
FIG. 4A is a photograph of a cover window according to Example 1 after a pen pressing test.
Figure 4B:
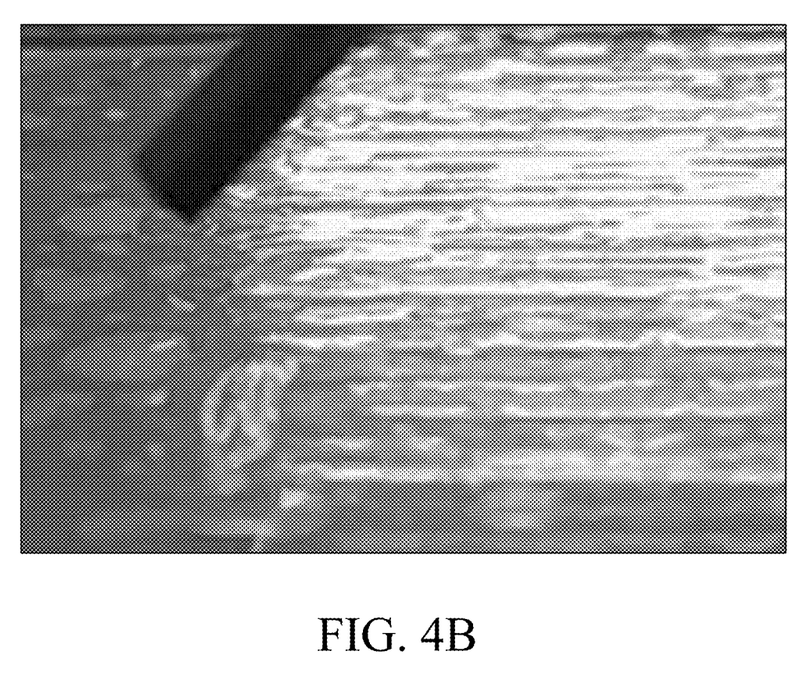
FIG. 4B is a photograph of a cover window according to Comparative Example 1 after a pen pressing test.

FIG. 4A is a photograph after evaluating a pressing property of a cover window according to Example 1 and FIG. 4B is a photograph after evaluating a pressing property of a cover window according to Comparative Example 1. Referring to FIG. 4A, it is confirmed that in the cover window according to Example 1, the surface was not torn or scratched and a pressing mark was observed immediately after the pressing test, but quickly recovered. Referring to FIG. 4B, it is confirmed that in the cover window according to Comparative Example 1, a pressing mark, a scratch, and a torn mark were observed.

The cover window according to the present disclosure has a high surface hardness, an excellent wear resistance, and an excellent optical property with an excellent restorability after being pressed. Further, the cover window according to the present disclosure is formed by laminating the first layer, the second layer, and the third layer with different moduli to have an excellent flexibility and may be recovered without being deformed when the cover window is folded or rolled and then unfolded. Therefore, the cover window may be applied to a flexible display device which is foldable or rollable.

Hereinafter, a flexible display device including a cover window according to the present disclosure will be described in detail. A technical characteristic of the cover window included in the flexible display device overlaps the technical characteristic of the above-described cover window, so that a redundant description thereof will be omitted.

Figure 5:
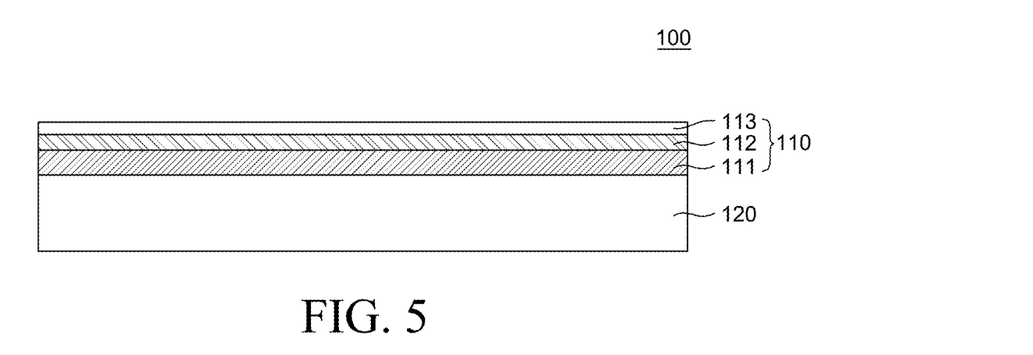
FIG. 5 is a cross-sectional view of a flexible display device according to an exemplary embodiment of the present disclosure.

FIG. 5 is a cross-sectional view of a flexible display device according to an exemplary embodiment of the present disclosure. Referring to FIG. 5, the flexible display device 100 according to the exemplary embodiment of the present disclosure includes an organic light emitting display panel 120 and a cover window 110. Even though in FIG. 5, for the convenience of description, it is illustrated that the display panel is an organic light emitting display panel, the display panel is not limited thereto.

The organic light emitting display panel 120 includes a display area and a non-display area. The display area is an area where a plurality of pixels is disposed to display images. In the display area, pixels including an emission area for displaying images and a driving circuit for driving the pixels may be disposed. The non-display area is disposed so as to enclose the display area. The non-display area is an area where images are not displayed and various wiring lines, driving ICs, printed circuit boards, and the like for driving the pixels and the driving circuits disposed in the display area are disposed.

The organic light emitting display panel 120 may include a flexible substrate and an organic light emitting diode.

The flexible substrate supports various elements which configure the organic light emitting display panel 120. The flexible substrate may be a plastic substrate having flexibility. For example, the plastic substrate may be selected from polyimide, polyethersulfone, polyethylene terephthalate, and polycarbonate, but is not limited thereto. The plastic substrate has a relatively weak barrier characteristic against moisture or oxygen so that in order to compensate therefor, the plastic substrate may have a structure in which a plastic film and an inorganic film are laminated. For example, the flexible substrate may have a multilayered structure in which a first polyimide film, an inorganic film, and a second polyimide film are sequentially laminated.

When the plastic substrate is used, the thickness is small so that a sagging phenomenon may be caused. Therefore, in order to compensate therefor, a back plate may be disposed on a rear surface of the flexible substrate. The back plate may be, for example, a metal material such as stainless steel or a plastic material.

The organic light emitting diode is disposed on the flexible substrate. The organic light emitting diode may include an anode, a cathode, and an organic light emitting layer disposed therebetween. In the organic light emitting diode, holes injected from the anode and electrons injected from the cathode are coupled on the organic light emitting layer to emit light. The image may be displayed using the light emitted as described above.

A driving thin film transistor may be disposed between the flexible substrate and the organic light emitting diode to drive the organic light emitting diode.

The cover window 110 is disposed on the organic light emitting display panel 120 to protect the organic light emitting display panel 120 so as not to be damaged or scratched by the external impact.

The cover window 110 may be adhered onto the organic light emitting display panel 120 by means of an adhesive layer. For example, the adhesive layer may include an optical clear adhesive (OCA) or a pressure sensitive adhesive PSA, but is not limited thereto.

The cover window 110 includes a first layer 111, a second layer 112, and a third layer 113.

The first layer 111 is disposed above the organic light emitting display panel 120. For example, the first layer 111 is configured so as to have a first modulus of 50 MPa to 100 MPa and has excellent tensile property and hardness to allow the flexible display device 100 to be easily folded or rolled and reduce the dent generated on the surface of the cover window 110.

For example, the first layer 111 includes a first polyurethane including a repeating unit represented by Formula 2-1.

The second layer 112 is disposed on the first layer 111. For example, the second layer 112 may be configured to have a second modulus of 5 MPa to 20 MPa. Therefore, the restorability against the deformation is excellent so that when the flexible display device 100 is folded or rolled and then unfolded, even though a pressing mark is generated on the surface of the cover window 110, the mark may be quickly recovered.

For example, the second layer 112 includes a second polyurethane including a repeating unit represented by Formula 2-2. Therefore, the recovery characteristic against the pressing is excellent so that the flexible display device 100 may be folded and rolled while reducing the deformation.

The third layer 113 is disposed on the second layer 112. The third layer 113 is configured to have a third modulus of 100 MPa to 250 MPa. Therefore, advantages in that the surface hardness is high, the scratch resistance and wear resistance are excellent are provided.

For example, the third layer 113 includes a silica-third polyurethane complex represented by Formula 3. As illustrated in FIG. 2, the silica-third polyurethane complex is bonded to the adjacent silica-third polyurethane to form a network structure. Accordingly, the folding and the rolling are easy with excellent optical property and surface characteristic.

If necessary, a functional layer may be selectively coated above the third layer 113. For example, the functional layer may include an anti-fingerprint coating layer, an anti-contamination coating layer, an anti-reflection coating layer, but is not limited thereto.

Figure 6:
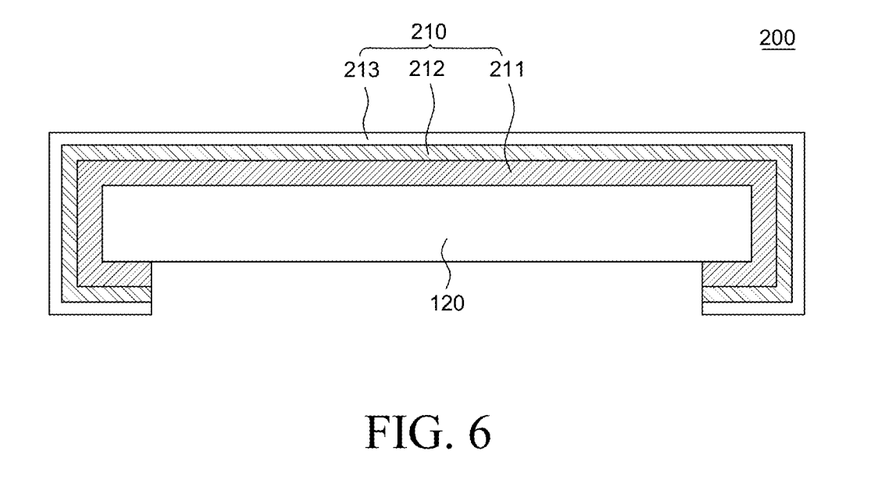
FIG. 6 is a cross-sectional view of a flexible display device according to another exemplary embodiment of the present disclosure.

FIG. 6 is a cross-sectional view of a flexible display device according to another exemplary embodiment of the present disclosure. A flexible display device illustrated in FIG. 6 has a different placement structure of a cover window from that of the flexible display device illustrated in FIG. 5, but is substantially similar or the same as the flexible display device illustrated in FIG. 5. Therefore, a redundant description will be omitted.

Referring to FIG. 6, a width of a cover window 210 may be larger than that of the organic light emitting display panel 120. Accordingly, the cover window 210 may be disposed to enclose at least a part of a side surface and a rear surface of the organic light emitting display panel 120.

Specifically, for example, the cover window 210 may have a horizontal length and a vertical length longer than those of the organic light emitting display panel 120 and may be disposed to enclose the entire side surface and an edge of the rear surface of the organic light emitting display panel 120.

When the flexible display device 200 is folded or rolled, slip occurs between elements which configure the flexible display device 200. When the slip occurs, an adhesive layer which is thin and has a small hardness is applied with a relatively larger stress and layers bonded by means of the adhesive layer may be separated.

The cover window 210 of the present disclosure has excellent flexibility and elasticity so that the cover window is easily stretched to cover a part of the side surface and the rear surface of the organic light emitting display panel 120. As described above, the cover window 210 is disposed so as to enclose a part of the side surface and the rear surface of the organic light emitting display panel 120 so that when the flexible display device 200 is folded and rolled, the slip between elements which configure the flexible display device 200 may be reduced and separation between layers may be suppressed.

The exemplary embodiments of the present disclosure can also be described as follows:

According to an aspect of the present disclosure, a cover window includes a first layer having a first modulus, a second layer disposed on the first layer and having a second modulus smaller than the first modulus, and a third layer disposed on the second layer and having a third modulus equal to or larger than the first modulus, wherein the third layer includes a nanoparticle-polyurethane complex in which polyurethane is bonded with nanoparticles by a covalent bond.

The first modulus may be 50 MPa to 100 MPa, the second modulus is 5 MPa to 20 MPa, and the third modulus may be 100 MPa to 250 MPa.

The first layer may include a first polyurethane having a weight average molecular weight of 65000 g/mol to 85000 g/mol, the second layer may include a second polyurethane having a weight average molecular weight of 90000 g/mol to 120000 g/mol, and the third layer may include a third polyurethane having a weight average molecular weight of 30000 g/mol to 60000 g/mol.

A thickness of the first layer may be 150 μm to 250 μm, a thickness of the second layer may be 30 μm to 55 μm, and a thickness of the third layer may be 5 μm to 10 μm.

The first polyurethane may be include a repeating unit represented by Formula 2-1, the second polyurethane may be include a repeating unit represented by Formula 2-2, and the third polyurethane may be include a repeating unit represented by Formula 2-3.

[Formula 2-1]

[Formula 2-2]

[Formula 2-3]

A pencil hardness of the cover window may be 1H or higher and a haze thereof may be 5 or lower.

The nanoparticle may be silica sol or silica with a surface modified with a hydroxyl group.

The first polyurethane may be configured by a soft segment including polyols represented by Formula 1-1 and a hard segment including a diisocyanate compound, the second polyurethane may be configured by a soft segment including polyols represented by Formula 1-2 and a hard segment including a diisocyanate compound, and the third polyurethane may be configured by a soft segment including polyols represented by Formula 1-3 and a hard segment including a diisocyanate compound.

In the above Formulae 2-1, 2-2, and 2-3, R4 may be an aryl group of 6 to 20 carbon atoms, R5 may be an alkylene of 4 to 20 carbon atoms or a cycloalkylene of 6 to 20 carbon atoms, x, y, and z may be integers of 10 to 10000, independently, and R1, R2, R3, a, b, and c may be the same as defined in the above Formulae 1-1, 1-2, and 1-3.

The third layer may be include 1 part by weight to 4 parts by weight of the nanoparticles based on 100 parts by weight of the diisocyanate compound.

The polyurethane of nanoparticle-polyurethane complex may be bonded with polyurethane of an adjacent nanoparticle-polyurethane complex to form a network structure.

According to an another aspect of the present disclosure, a flexible display device includes a display panel including a display area and a non-display area, and a cover window including a first layer disposed on one surface of the display panel and having a first modulus, a second layer disposed on the first layer and having a second modulus smaller than the first modulus, and a third layer disposed on the second layer and having a third modulus equal to or larger than the first modulus, wherein the third layer includes a nanoparticle-polyurethane complex in which polyurethane is bonded with nanoparticles by a covalent bond.

The display panel may be include a flexible substrate and an organic light emitting diode disposed on the flexible substrate.

The first modulus may be 50 MPa to 100 MPa, the second modulus may be 5 MPa to 20 MPa, and the third modulus is 100 MPa to 250 MPa.

The nanoparticle may be silica sol or silica with a surface modified with a hydroxyl group.

The first layer may be include a first polyurethane including a repeating unit represented by Formula 2-1, the second layer may be include a second polyurethane including a repeating unit represented by Formula 2-2, and the third layer may be include a third polyurethane including a repeating unit represented by Formula 2-3.

[Formula 1-1]

[Formula 1-2]

[Formula 1-3]

In Formulae 1-1, 1-2, and 1-3, R1 may be a chain or branched alkylene of 2 to 12 carbon atoms, R2 may be an alkylene of 2 to 12 carbon atoms or a phenylene, R3 may be an ether group of 2 to 12 carbon atoms, and a, b, and c may be integers of 1 or larger, independently.

[Formula 2-1]

[Formula 2-2]

[Formula 2-3]

In Formulae 2-1, 2-2, and 2-3, R1 may be a chain or branched alkylene of 2 to 12 carbon atoms, R2 may be an alkylene of 2 to 12 carbon atoms or a phenylene, R3 may be an ether group of 2 to 12 carbon atoms, R4 may be an aryl group of 6 to 20 carbon atoms, R5 may be an alkylene of 4 to 20 carbon atoms or a cycloalkylene of 6 to 20 carbon atoms, x, y, and z may be integers of 10 to 10000, independently, and a, b, and c may be integers of 1 or larger, independently.

The third layer may be include 1 part by weight to 4 parts by weight of the nanoparticles based on 100 parts by weight of the diisocyanate compound.

The polyurethane of nanoparticle-polyurethane complex may be bonded with polyurethane of an adjacent nanoparticle-polyurethane complex to form a network structure.

A width of the cover window may be larger than a width of the display panel.

The cover window may be enclose at least a part of a side surface and a rear surface of the display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A cover window configured to be disposed on a display panel, comprising:
a first layer having a first modulus;
a second layer disposed on the first layer and having a second modulus smaller than the first modulus; and
a third layer disposed on the second layer and having a third modulus equal to or larger than the first modulus,
wherein the third layer includes a nanoparticle-polyurethane complex in which polyurethane is bonded with nanoparticles by a covalent bond,
wherein the first modulus, the second modulus, and the third modulus refers to a Young's modulus.

2. The cover window according to claim 1, wherein the first modulus is 50 MPa to 100 MPa, the second modulus is 5 MPa to 20 MPa, and the third modulus is 100 MPa to 250 MPa.

3. The cover window according to claim 1, wherein a thickness of the first layer is 150 μm to 250 μm, a thickness of the second layer is 30 μm to 55 μm, and a thickness of the third layer is 5 μm to 10 μm.

4. The cover window according to claim 1, wherein a pencil hardness of the cover window is 1H or higher and a haze thereof is 5 or lower.

5. The cover window according to claim 1, wherein the polyurethane of the nanoparticle-polyurethane complex is bonded with polyurethane of an adjacent nanoparticle-polyurethane complex to form a network structure.

6. A cover window, comprising:
a first layer having a first modulus;
a second layer disposed on the first layer and having a second modulus smaller than the first modulus; and
a third layer disposed on the second layer and having a third modulus equal to or larger than the first modulus,
wherein the third layer includes a nanoparticle-polyurethane complex in which polyurethane is bonded with nanoparticles by a covalent bond, and
wherein the first layer includes a first polyurethane having a weight average molecular weight of 65000 g/mol to 85000 g/mol, the second layer includes a second polyurethane having a weight average molecular weight of 90000 g/mol to 120000 g/mol, and the third layer includes a third polyurethane having a weight average molecular weight of 30000 g/mol to 60000 g/mol,
wherein the first modulus, the second modulus, and the third modulus refers to a Young's modulus.

7. The cover window according to claim 6, wherein the first polyurethane is configured by a soft segment including polyols represented by Formula 1-1 and a hard segment including a diisocyanate compound, the second polyurethane is configured by a soft segment including polyols represented by Formula 1-2 and a hard segment including a diisocyanate compound, and the third polyurethane is configured by a soft segment including polyols represented by Formula 1-3 and a hard segment including a diisocyanate compound,

[Formula 1-1]

[Formula 1-2]

[Formula 1-3]

wherein in Formulae 1-1, 1-2, and 1-3, R1 is a chain or branched alkylene of 2 to 12 carbon atoms, R2 is an alkylene of 2 to 12 carbon atoms or a phenylene, R3 is an ether group of 2 to 12 carbon atoms, and a, b, and c are integers of 1 or larger, independently.

8. The cover window according to claim 7, wherein the first polyurethane includes a repeating unit represented by Formula 2-1, the second polyurethane includes a repeating unit represented by Formula 2-2, and the third polyurethane includes a repeating unit represented by Formula 2-3,

[Formula 2-1]

[Formula 2-2]

[Formula 2-3]

wherein in the Formulae 2-1, 2-2, and 2-3, R4 is an aryl group of 6 to 20 carbon atoms, R5 is an alkylene of 4 to 20 carbon atoms or a cycloalkylene of 6 to 20 carbon atoms, x, y, and z are integers of 10 to 10000, independently.

9. The cover window according to claim 7, wherein the third layer includes 1 part by weight to 4 parts by weight of the nanoparticles based on 100 parts by weight of the diisocyanate compound.

10. A cover window, comprising:
a first layer having a first modulus;
a second layer disposed on the first layer and having a second modulus smaller than the first modulus; and
a third layer disposed on the second layer and having a third modulus equal to or larger than the first modulus,
wherein the third layer includes a nanoparticle-polyurethane complex in which polyurethane is bonded with nanoparticles by a covalent bond, and wherein the nanoparticle is silica sol or silica with a surface modified with a hydroxyl group,
wherein the first modulus, the second modulus, and the third modulus refers to a Young's modulus.

11. A flexible display device, comprising:
a display panel; and
a cover window disposed on the display panel, the cover window including a first layer disposed on one surface of the display panel and having a first modulus, a second layer disposed on the first layer and having a second modulus smaller than the first modulus, and a third layer disposed on the second layer and having a third modulus equal to or larger than the first modulus,
wherein the third layer includes a nanoparticle-polyurethane complex in which polyurethane is bonded with nanoparticles by a covalent bond,
wherein the first modulus, the second modulus, and the third modulus refers to a Young's modulus.

12. The flexible display device according to claim 11, wherein the display panel includes a flexible substrate and an organic light emitting diode disposed on the flexible substrate.

13. The flexible display device according to claim 11, wherein the first modulus is 50 MPa to 100 MPa, the second modulus is 5 MPa to 20 MPa, and the third modulus is 100 MPa to 250 MPa.

14. The flexible display device according to claim 11, wherein the polyurethane of the nanoparticle-polyurethane complex is bonded with polyurethane of an adjacent nanoparticle-polyurethane complex to form a network structure.

15. The flexible display device according to claim 11, wherein a width of the cover window is larger than a width of the display panel.

16. The flexible display device according to claim 15, wherein the cover window encloses at least a part of a side surface and a rear surface of the display panel.

17. A flexible display device, comprising:
a display panel; and
a cover window disposed on the display panel, the cover window including a first layer disposed on one surface of the display panel and having a first modulus, a second layer disposed on the first layer and having a second modulus smaller than the first modulus, and a third layer disposed on the second layer and having a third modulus equal to or larger than the first modulus,
wherein the third layer includes a nanoparticle-polyurethane complex in which polyurethane is bonded with nanoparticles by a covalent bond, and wherein the nanoparticle is silica sol or silica with a surface modified with a hydroxyl group,
wherein the first modulus, the second modulus, and the third modulus refers to a Young's modulus.

18. A flexible display device, comprising:
a display panel; and
a cover window disposed on the display panel, the cover window including a first layer disposed on one surface of the display panel and having a first modulus, a second layer disposed on the first layer and having a second modulus smaller than the first modulus, and a third layer disposed on the second layer and having a third modulus equal to or larger than the first modulus,
wherein the third layer includes a nanoparticle-polyurethane complex in which polyurethane is bonded with nanoparticles by a covalent bond, and
wherein the first layer includes a first polyurethane including a repeating unit represented by Formula 2-1, the second layer includes a second polyurethane including a repeating unit represented by Formula 2-2, and the third layer includes a third polyurethane including a repeating unit represented by Formula 2-3,

[Formula 2-1]

[Formula 2-2]

[Formula 2-3]

wherein in Formulae 2-1, 2-2, and 2-3, R1 is a chain or branched alkylene of 2 to 12 carbon atoms, R2 is an alkylene of 2 to 12 carbon atoms or a phenylene, R3 is an ether group of 2 to 12 carbon atoms, R4 is an aryl group of 6 to 20 carbon atoms, R5 is an alkylene of 4 to 20 carbon atoms or a cycloalkylene of 6 to 20 carbon atoms, x, y, and z are integers of 10 to 10000, independently, and a, b, and c are integers of 1 or larger, independently,
wherein the first modulus, the second modulus, and the third modulus refers to a Young's modulus.

19. The flexible display device according to claim 18, wherein the third layer includes 1 part by weight to 4 parts by weight of the nanoparticles based on 100 parts by weight of a diisocyanate compound.

\* \* \* \* \*